(12) United States Patent
Li et al.

(10) Patent No.: US 11,961,437 B2
(45) Date of Patent: Apr. 16, 2024

(54) DISPLAY PANEL AND DISPLAY APPARATUS

(71) Applicant: SHENZHEN CHINA STAR OPTOELECTRONICS SEMICONDUCTOR DISPLAY TECHNOLOGY CO., LTD., Shenzhen (CN)

(72) Inventors: Deyan Li, Shenzhen (CN); Jianhong Chen, Shenzhen (CN); Peng Du, Shenzhen (CN); Xiaoming Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 298 days.

(21) Appl. No.: 17/438,449

(22) PCT Filed: Jul. 16, 2021

(86) PCT No.: PCT/CN2021/106774
§ 371 (c)(1),
(2) Date: Sep. 12, 2021

(87) PCT Pub. No.: WO2022/267113
PCT Pub. Date: Dec. 29, 2022

(65) Prior Publication Data
US 2023/0335028 A1    Oct. 19, 2023

(30) Foreign Application Priority Data

Jun. 23, 2021    (CN) .......................... 202110697177.1

(51) Int. Cl.
*G09G 3/20*     (2006.01)
*H01L 27/12*    (2006.01)

(52) U.S. Cl.
CPC ............. *G09G 3/20* (2013.01); *H01L 27/124* (2013.01); *G09G 2300/0408* (2013.01);
(Continued)

(58) Field of Classification Search
CPC .......... G09G 3/36; G09G 3/3275; G09G 3/30; G09G 3/20; G09G 2300/0408;
(Continued)

(56) References Cited

U.S. PATENT DOCUMENTS

2003/0197666 A1    10/2003    Akimoto et al.
2012/0139969 A1*   6/2012    Yokoyama ........... G09G 3/3233
                                                           345/690

(Continued)

FOREIGN PATENT DOCUMENTS

CN    101334555 A    12/2008
CN    101806969 A    8/2010
(Continued)

*Primary Examiner* — Michael A Faragalla
(74) *Attorney, Agent, or Firm* — The Roy Gross Law Firm, LLC; Roy Gross (57) ABSTRACT

The embodiment of the present disclosure provides a display panel and a display apparatus. The display panel includes a long side, a short side, a display pixel, a scan driving circuit, a drive circuit board, and chips on film. one end of each chip on film is coupled to the short side, and another end is coupled to the drive circuit board. The drive circuit board and the scan driving circuit of the embodiment of the present disclosure are respectively located on the short side and the long side of the display panel to improve the problem that the font is easily deformed during display.

9 Claims, 4 Drawing Sheets

(52) U.S. Cl.
CPC ............. *G09G 2310/0202* (2013.01); *G09G 2310/0267* (2013.01); *G09G 2320/02* (2013.01)

(58) Field of Classification Search
CPC ... G09G 2310/0202; G09G 2310/0267; G09G 2320/02; H01L 27/124
See application file for complete search history.

(56) References Cited

U.S. PATENT DOCUMENTS

2012/0229525 A1\* 9/2012 Nakai .................. G09G 3/3648
345/96
2016/0365046 A1 12/2016 Chen et al.

FOREIGN PATENT DOCUMENTS

| | | |
|---|---|---|
| CN | 103117292 A | 5/2012 |
| CN | 104656295 A | 5/2015 |
| CN | 104950497 A | 9/2015 |
| CN | 107272940 A | 10/2017 |
| CN | 208141704 U | 11/2018 |
| CN | 209014756 U | 6/2019 |
| CN | 112083595 A | 12/2020 |
| IN | 111145685 A | 5/2020 |

\* cited by examiner

DISPLAY PANEL AND DISPLAY APPARATUS

CROSS REFERENCE TO RELATED APPLICATIONS

This application is a National Phase of PCT Patent Application No. PCT/CN2021/106774 having International filing date of Jul. 16, 2021, which claims the benefit of priority of Chinese Application No. 202110697177.1 filed Jun. 23, 2021. The contents of the above applications are all incorporated by reference as if fully set forth herein in their entirety.

FIELD OF THE INVENTION

The present disclosure relates to display technology field, and more particularly to a display panel and a display apparatus.

BACKGROUND

ClearType is a software technology developed by Microsoft to improve the readability of the text on the existing display screen and make the text on the screen look clearer and more obvious. At present, for most display screens for monitors or TVs on the market, the drive circuit board is located on the long side of the display, while the scan driving circuit is located on the short side of the display panel. When ClearType is turned on, display problems such as font deformation may appear.

To improve the display effect, reduce the number of source driver chips used, and reduce the manufacturing cost and power consumption, a tri-gate drive architecture is proposed by those skilled in the art. In the Tri-gate drive architecture, although the number of chips on film used can be reduced to a certain extent to achieve the goal of reducing the manufacturing cost, when the ClearType algorithm is run to display fonts, the drive architecture has problems such as easy deformation of the font displayed on the corresponding display screen and unsatisfactory display effect.

Therefore, it is necessary to provide a new drive architecture to improve the problem of easy deformation of fonts when the display panel is displaying, while reducing the manufacturing cost of the panel and improving the display effect.

SUMMARY

To solve the above-mentioned problem, the embodiment of the present application provides a display panel and a display apparatus, which are used to solve the problem of font deformation in the display apparatus in the prior art when displaying.

To solve the above technical problem, the technical solutions of the embodiment of the present disclosure are as follows.

One object of the embodiment of the present disclosure is to provide a display panel. The display panel includes:
a display substrate including:
 a first long side, a second long side, a first short side, and a second short side, the first long side is parallel to the second long side, and the first short side is parallel to the second short side,
 a plurality of gate signal lines and a plurality of data signal lines disposed in array, and
 a plurality of pixel units disposed in the area where the gate signal lines and the data signal lines intersect, the plurality of pixel units form a plurality of pixel columns on the display substrate, each of the pixel units includes a plurality of sub-pixels, each of the sub-pixels is coupled to the corresponding gate signal lines and the corresponding data signal lines,
a scan driving circuit disposed in a corresponding area of the long side edge of the display substrate, and coupled to the gate signal lines correspondingly,
a drive circuit board disposed in a corresponding area of the short side edge of the display substrate, and coupled to the data signal lines correspondingly, and
a chip on film disposed in the corresponding area of the short side edge of the display substrate, and one end of the chip on film is coupled to the display substrate, and the other end of the chip on film is coupled to the drive circuit board. A first gap is between the drive circuit board and the first short side, and the chip on film is disposed in the first gap.

According to one embodiment of the present disclosure, the scan driving circuit includes a first scan driving circuit and a second scan driving circuit, the first scan driving circuit is disposed at the edge of the first long side, the second scan driving circuit is disposed at the edge of the second long side.

According to one embodiment of the present disclosure, the pixel columns includes a first pixel column, a second pixel column, and a third pixel column set in sequence, a first data line and a second data line are correspondingly disposed between the first pixel column, the second pixel column, and the third pixel column. The (2i−1)th pixel unit in the first pixel column is coupled to the first data line, the (2i)th pixel unit in the second pixel column is coupled to the first data line, the (2i−1)th pixel unit in the second pixel column is coupled to the second data line, and the (2i)th pixel unit in the third pixel column is coupled to the second data line, i is an integer greater than 0.

According to one embodiment of the present disclosure, a data line is disposed between two adjacent pixel columns, a scan line is disposed between two adjacent pixel rows, and each of the plurality of sub-pixels disposed along the short side corresponds to the same scan line.

According to one embodiment of the present disclosure, the drive circuit board and the chip on film are correspondingly disposed in the corresponding areas of the short side edges on both sides of the display substrate.

According to one embodiment of the present disclosure, the pixel unit includes a red sub-pixel, a blue sub-pixel, and a green sub-pixel.

According to one embodiment of the present disclosure, the red sub-pixel, the blue sub-pixel, and the green sub-pixel are disposed along the short side of the display substrate in sequence.

Another objective of the embodiment of the present disclosure is to provide a display panel. The display panel includes:
a display substrate, including:
 a first long side, a second long side, a first short side, and a second short side, the first long side is parallel to the second long side, and the first short side is parallel to the second short side,
 a plurality of gate signal lines and a plurality of data signal lines disposed in array, and
 a plurality of pixel units disposed in the area where the gate signal lines and the data signal lines intersect, the plurality of pixel units form a plurality of pixel columns on the display substrate, each of the pixel units includes a plurality of sub-pixels, each of the sub-pixels is coupled to the corresponding gate signal line and the corresponding data signal line, a scan driving circuit disposed in a corresponding area of the long side edge of the display substrate, and coupled to the gate signal lines correspondingly, a drive circuit board disposed in a corresponding area of the short side edge of the display substrate, and coupled to the data signal lines correspondingly, and a chip on film disposed in the corresponding area of the short side edge of the display substrate, and one end of the chip on film is coupled to the display substrate, and the other end of the chip on film is coupled to the drive circuit board.

According to one embodiment of the present disclosure, the scan driving circuit includes a first scan driving circuit and a second scan driving circuit, the first scan driving circuit is disposed at the edge of the first long side, the second scan driving circuit is disposed at the edge of the second long side.

According to one embodiment of the present disclosure, the pixel columns include a first pixel column, a second pixel column, and a third pixel column set in sequence, a first data line and a second data line are correspondingly disposed between the first pixel column, the second pixel column, and the third pixel column. The (2i−1)th pixel unit in the first pixel column is coupled to the first data line, the (2i)th pixel unit in the second pixel column is coupled to the first data line, the (2i−1)th pixel unit in the second pixel column is coupled to the second data line, and the (2i)th pixel unit in the third pixel column is coupled to the second data line, i is an integer greater than 0.

According to one embodiment of the present disclosure, a data line is disposed between two adjacent pixel columns, a scan line is disposed between two adjacent pixel rows, and each of the plurality of sub-pixels disposed along the short side corresponds to the same scan line.

According to one embodiment of the present disclosure, the drive circuit board and the chip on film are correspondingly disposed in the corresponding areas of the short side edges on both sides of the display substrate.

According to one embodiment of the present disclosure, the number of the chip on film disposed in the corresponding area of the short side edge of the display substrate is two or three.

According to one embodiment of the present disclosure, the pixel unit includes a red sub-pixel, a blue sub-pixel, and a green sub-pixel.

According to one embodiment of the present disclosure, the red sub-pixel, the blue sub-pixel, and the green sub-pixel are disposed along the short side of the display substrate in sequence.

The other objective of the embodiment of the present disclosure is to provide a display apparatus. The display apparatus includes a display panel. The display panel includes:

a display substrate, including:
 a first long side, a second long side, a first short side, and a second short side, the first long side is parallel to the second long side, and the first short side is parallel to the second short side, and
 a plurality of pixel units, each of the pixel units includes a plurality of sub-pixels disposed adjacently, and the pixel units form a plurality of pixel columns, a scan driving circuit, disposed in a corresponding area of the long side edge of the display substrate, and coupled to the gate signal lines correspondingly, a drive circuit board, disposed in a corresponding area of the short side edge of the display substrate, and coupled to the data signal lines correspondingly, and a chip on film, disposed in the corresponding area of the short side edge of the display substrate, and one end of the chip on film is coupled to the display substrate, and the other end of the chip on film is coupled to the drive circuit board.

According to one embodiment of the present disclosure, the scan driving circuit includes a first scan driving circuit and a second scan driving circuit, the first scan driving circuit is disposed at the edge of the first long side, the second scan driving circuit is disposed at the edge of the second long side.

According to one embodiment of the present disclosure, the drive circuit board and the chip on film are correspondingly disposed in the corresponding areas of the short side edges on both sides of the display substrate.

According to one embodiment of the present disclosure, the pixel columns include a first pixel column, a second pixel column, and a third pixel column, a first data line and a second data line are correspondingly disposed between the first pixel column, the second pixel column, and the third pixel column. The (2i−1)th pixel unit in the first pixel column is coupled to the first data line, the (2i)th pixel unit in the second pixel column is coupled to the first data line, the (2i−1)th pixel unit in the second pixel column is coupled to the second data line, and the (2i)th pixel unit in the third pixel column is coupled to the second data line, i is an integer greater than 0.

According to one embodiment of the present disclosure, a data line is disposed between two adjacent pixel columns, a scan line is disposed between two adjacent pixel rows, and each of the plurality of sub-pixels disposed along the short side corresponds to the same scan line.

In the embodiment of the present disclosure, the drive circuit board is located on the short side of the display panel, the chip on film connects the drive circuit board and the display panel, the array substrate column scan driving circuit is located on the long side of the display panel, the display pixels maintain RGB columns along the long side of the display panel, the array substrate column scan driving circuit is connected to the gate, and the drive circuit board is connected to the data line. Compared with the prior art, the drive circuit board is disposed on the long side of the display panel, and the array substrate column scan driving circuit is disposed on the short side of the display panel, so the embodiment of the present disclosure can achieve the effect of improving font deformation.

DETAILED DESCRIPTION OF PREFERRED EMBODIMENTS

Specifically, the terminologies in the embodiments of the present disclosure are merely for describing the purpose of the certain embodiment, but not to limit the invention. Examples and the appended claims be implemented in the present disclosure requires the use of the singular form of the book "a", "an" and "the" are intended to include most forms unless the context clearly dictates otherwise. It should also be understood that the terminology used herein that "and/or" means and includes any or all possible combinations of one or more of the associated listed items.

Figure 1:
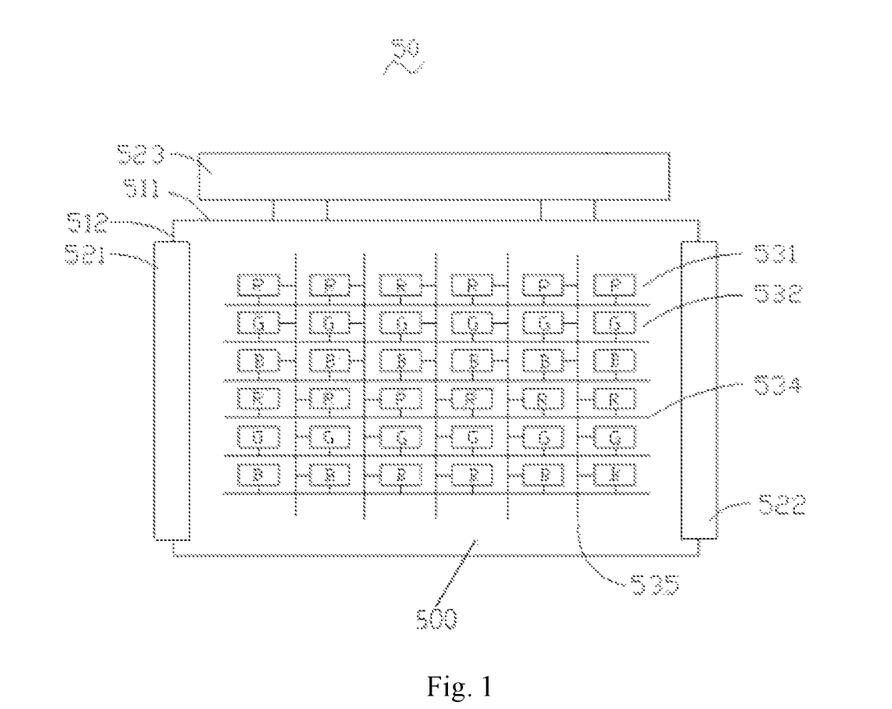
FIG. 1 is a schematic diagram of a tri-gate design according to the embodiment of the present disclosure.
Figure 2:
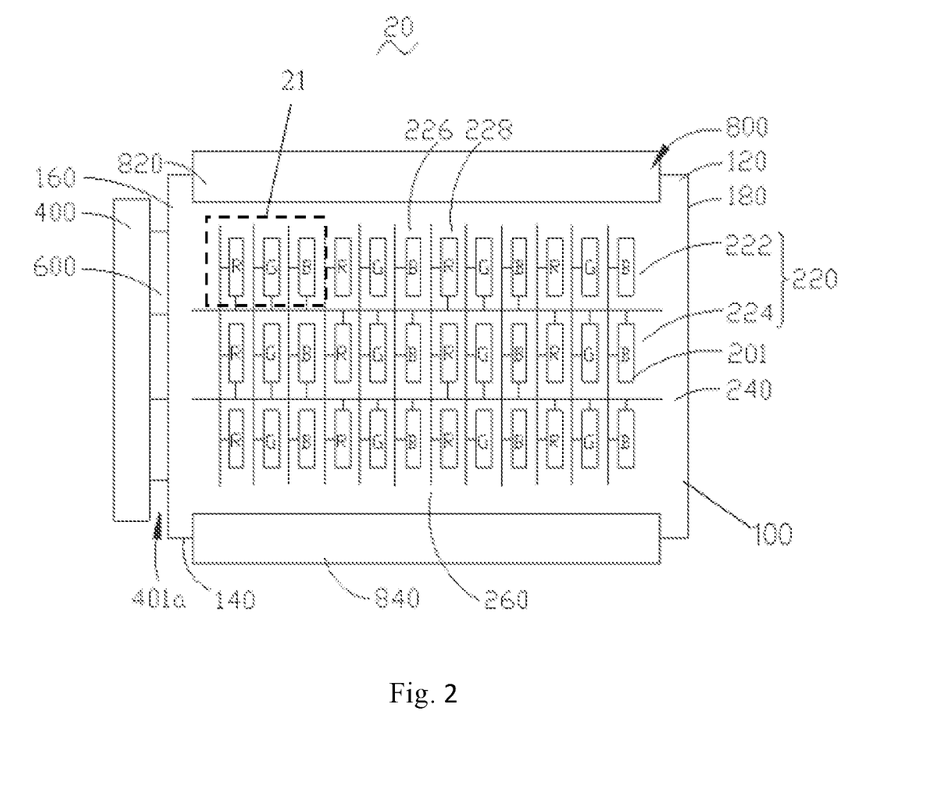
FIG. 2 is a first architecture schematic diagram of the display apparatus according to the embodiment of the present disclosure.
Figure 3:
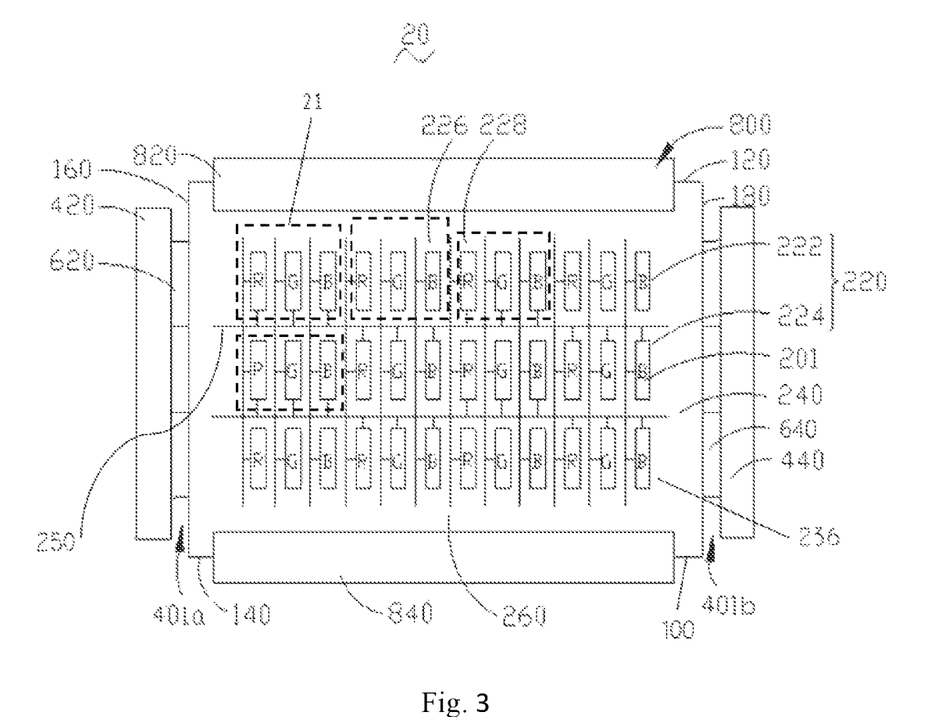
FIG. 3 is a second architecture schematic diagram of the display apparatus according to the embodiment of the present disclosure.

Please refer to FIGS. 1-3, FIG. 1 depicts a schematic diagram of a tri-gate design according to the embodiment of the present disclosure, FIG. 2 depicts a first schematic diagram of the display apparatus according to the embodiment of the present disclosure, and FIG. 3 depicts a second schematic diagram of the display apparatus according to the embodiment of the present disclosure.

Please refer to FIG. 1, it should be noted, the display apparatus 50 corresponding to the traditional tri-gate architecture includes the display panel 500. The display panel 500 includes two long sides 511, two short sides 512, a first scan driving circuit 521 of array substrate row, a second scan driving circuit 522 of array substrate row, a drive circuit board 523, the first sub-pixel row 531, and the second sub-pixel row 532. A scan line 534 is disposed between the first sub-pixel row 531 and the second sub-pixel row 532.

In addition, in the column direction of the display panel, a data line 535 is disposed between every two adjacent sub-pixel columns. And in the column direction, each sub-pixel column includes a plurality of pixel units, and each pixel unit includes a plurality of sub-pixels such as the red sub-pixel R, the green sub-pixel G, and the blue sub-pixel B. That is, the RGB three-color sub-pixels form a pixel unit. The plurality of pixel units contained in it are disposed in sequence along the short side of the display panel, and the connection between the data line 535 and the pixel unit in the column direction is misaligned, as shown in FIG. 1.

The embodiment of the present disclosure provides a connection architecture inside the display panel to effectively improve the ambiguity of the panel when it is displaying. Specifically, please refer to FIGS. 2 and 3.

Specifically, the embodiment of the present disclosure provides a tri-gate-new connection architecture and applies the tri-gate-new architecture in the display panel or other display apparatus. The display apparatus provided by the embodiment of the present disclosure can be a television, a monitor, or other display apparatus. The display apparatus has a long side and a short side. That is, for an observer, on the visual display of the display panel, the long side corresponds to the horizontal direction of vision, and the short side corresponds to the vertical direction of vision, or the long side corresponds to a length greater than the length corresponding to the short side. When disposing the tri-gate-new architecture, disposing the plurality of RGB three-color sub-pixels in sequence along the long side of the display panel, thereby forming the display apparatus provided by the embodiment of the present disclosure, as shown in FIG. 2.

Specifically, in the embodiment of the present disclosure, the display apparatus 20 includes a display panel 100, a drive circuit board 400, a chop on film 600, and a scan driving circuit 800.

Please refer to FIG. 2, it should be noted, the display apparatus 20 includes the display panel 100, the display panel 100 includes a first long side 120, a second long side 140, a first short side 160, and a second short side 180. The first long side 120 is parallel to the second long side 140, the first short side 160 is parallel to the second short side 180.

It should be noted, the display panel 100 can be rectangle architecture. It should be noted, the first long side 120, the second long side 140, the first short side 160, and the second short side 180 are connected in sequence to form a rectangle.

It should be noted, the display area of the display apparatus 20 includes a plurality of pixel units 21. The plurality of pixel units 21 are disposed in array in the display panel and form the light-emitting display area of the display panel. Each of the pixel units 21 includes a plurality of light-emitting sub-pixels. The plurality of light-emitting sub-pixels are disposed adjacently. In the embodiment of the present disclosure, the light-emitting sub-pixels are illustrated by taking the red sub-pixel R, the blue sub-pixel B, and the green sub-pixel G as examples. The light-emitting sub-pixels can also be other colors, which will not be described in detail here.

Specifically, please refer to FIG. 2, pixel units 21 include a plurality of sub-pixels. The sub-pixels include red sub-pixels R, blue sub-pixels B, and green sub-pixels G. Meanwhile, due to the array disposition of each pixel unit 21, a plurality of pixel columns are formed in the column direction of the display panel, such as the first pixel column 226 and the second pixel column 228. The first pixel column 226 and the second pixel column 228 are adjacent. In the row direction of the display panel, a plurality of RGB three-color sub-pixels are disposed in sequence along the first long side 120 and form a plurality of pixel row 220, such as the first pixel row 222 and the second pixel row 224.

It should be noted, the display apparatus 20 further includes a drive circuit board 400 and chips on film 600. The drive circuit board 400 is located outside the edge of the first short side 160. The number of the chips on film 600 is at least two. One side of each chip on film 600 is coupled to the first short side 160, and another side is coupled to the drive circuit board 400. The drive circuit board 400 is also coupled correspondingly to each data line in the display area of the display panel through lead wires. In the embodiment of the present disclosure, the drive circuit board 400 may only be disposed in the corresponding area of the edge of the short side on one side of the display panel, or disposed in the corresponding area of the edge of the short side on both sides of the display panel.

Please refer to FIG. 3, the display apparatus 20 further includes a scan driving circuit 800 coupled correspondingly to the gate signal line (i.e., the scan signal line) of the display panel through lead wires. The scan driving circuit 800 includes a first scan driving circuit 820 and a second scan driving circuit 840. The first scan driving circuit 820 is disposed at the edge of the first long side 120, and the second scan driving circuit 840 is disposed at the edge of the second long side 140.

It should be noted, the scan driving circuit 800 may only include the first scan driving circuit 820. The first scan driving circuit 820 is disposed at the edge of the first long side 120.

The length of the scan driving circuit 800 is shorter than the length of the long side of the display panel 100, and the length of the drive circuit board 400 is shorter than the length of the short side of the display panel 100.

Specifically, please refer to FIG. 3, a first gap 401a is between the drive circuit board 400 and the first short side 160, and the two chips on film 620 are located in the first gap 401a.

Please continue to refer to FIG. 3, in the embodiment of the present disclosure, a scan line 260 is disposed between every two adjacent pixel columns. The two adjacent pixel columns include the first pixel column 226 and the second pixel column 228. The first pixel column 226 is adjacent to the second pixel column 228, and each sub-pixel in the second pixel column 228 is coupled to the scan line 260 correspondingly.

It should be noted, the long side of the display panel is the first long side or the second long side, and the short side of the display panel is the first short side or the second short side.

Moreover, for a full HD display apparatus, the traditional tri-gate architecture design needs two chips on film, and the present invention also needs only two chips on film, so the costs are the same. For an ultra HD display apparatus, the traditional tri-gate architecture design needs four chips on film, and the present invention needs only three chips on film, so the cost is saved to a greater extent and the manufacturing process of the panel is effectively simplified.

Furthermore, please refer to FIG. 3, the display apparatus 20 includes the display panel 100. The display panel 100 includes the first long side 120, the second long side 140, the first short side 160, and the second short side 180. The first long side 120 is parallel to the second long side 140, and the first short side 160 is parallel to the second short side 180.

The display area of the display apparatus 20 includes a plurality of pixel units 21. The plurality of pixel units 21 are disposed in array in the display panel and form the light-emitting display area.

Due to the array disposition of each pixel unit 21, a plurality of pixel columns are formed in the column direction of the display panel, such as the first pixel column 226 and the second pixel column 228. The first pixel column 226 and the second pixel column 228 are adjacent. In the row direction of the display panel, a plurality of RGB three-color sub-pixels are disposed in sequence along the first long side 120 and form a plurality of pixel row 220, such as the first pixel row 222 and the second pixel row 224.

The display apparatus 20 further includes the drive circuit board. The drive circuit board is coupled to the data signal line correspondingly. The drive circuit board includes a first drive circuit board 420 and a second drive circuit board 440. The first drive circuit board 420 is located outside the edge of the first short side 160, and the second drive circuit board 440 is located outside the edge of the second short side 180.

The display apparatus 20 further includes chips on film. The chips on film include at least two first chips on film 620 and at least two second chips on film 640. The first chip on film 620 connects the first short side 160 and the first drive circuit board 420, and the second chip on film 640 connects the second short side 180 and the second drive circuit board 440. Please continue to refer to FIG. 3, the display apparatus 20 further includes a scan driving circuit 800. The scan driving circuit 800 includes a first scan driving circuit 820 and a second scan driving circuit 840. The second scan driving circuit 840 is disposed at the edge of the first long side 120, and the second scan driving circuit 840 is disposed at the edge of the second long side 140. The scan driving circuit 800 is coupled to the scan line 260 correspondingly.

The lengths of both the first scan driving circuit 820 and the second scan driving circuit 840 are the same, and less than the length of the long side of the display panel 100. The lengths of both the first drive circuit board 420 and the second drive circuit board 440 are the same, and less than the length of the short side of the display panel 100.

Specifically, please continue to refer to FIG. 3, the first gap 401a is between the first drive circuit board 420 and the first short side 160. The two first chips on film 620 are disposed at an interval in the first gap 401a. The second gap 401b is between the second drive circuit board 440 and the second short side 180. The two second chips on film 640 are disposed at an interval in the second gap 401b.

Please continue to FIG. 3, a data line is disposed between every two adjacent pixel rows 220. In the embodiment of the present disclosure, the pixel rows are illustrated by taking the first pixel row 222, the second pixel row 224, and the third pixel row 236 as examples. The first pixel row 222, the second pixel row 224, and the third pixel row 236 are adjacently disposed. Meanwhile, the data lines between two adjacent pixel rows are illustrated by taking the first data line 250 and the second data line 240 as examples.

In addition, the pixel units 21 in the corresponding pixel row include a plurality of RGB three-color sub-pixels. Specifically, the two adjacent pixel rows 220 include the first pixel row 222, the second pixel row 224, and the third pixel row 236. The RGB three-color sub-pixels 201 in the odd arrangement order in the first pixel row 222 are connected to the second data line 240, and the RGB three-color sub-pixels 201 in the even arrangement order in the second pixel row 224 are connected to the second data line 240. In the same row, two adjacent pixel units are respectively connected to two adjacent data lines.

Specifically, when each pixel unit 21 is set to connect to the data line, for the same pixel row, the pixel units 21 are disposed adjacently in sequence. Therefore, each pixel unit 21 can be labeled. Preferably, the pixel units 21 are labeled sequentially as 1, 2, 3, 4 . . . i. Among them, i≥1, and i is an integer.

In the first pixel row 222, the (2i−1)th pixel unit (such as the 1st, 3rd, 5th . . . ) is connected to the first data line 250, and in the second pixel row 224, the (2i)th pixel unit (such as the 2nd, 4th, 6th, 8th . . . ) is connected to the first data line 250 at the same time. The (2i−1)th pixel unit is equivalent to the odd sequence pixel unit, and the (2i)th pixel unit is equivalent to the even sequence pixel unit.

Meanwhile, in the second pixel row 224 and the third pixel row 236, the (2i−1)th pixel unit in the second pixel row 224 is connected to the second data line 240, and the (2i)th pixel unit in the third pixel row 236 is connected to the second data line 240 at the same time. In this way, in the same row of pixels, the pixel units of the odd sequence and the pixel units of the even sequence are respectively connected to the data lines in different rows, thereby improving the architecture of the display panel and effectively solving the problem that the displayed font is easily deformed when the panel is displaying.

Each pixel row 220 is connected to the second data line 240, and each of the plurality of RGB three-color sub-pixels disposed along the long side corresponds to the same second data line 240.

Please continue to refer to FIG. 3, a scan line 260 is disposed between every two adjacent pixel columns. The two adjacent pixel columns include the first pixel column 226 and the second pixel column 228. Each of the RGB three-color sub-pixels in the second pixel column 228 is connected to the scan line 260.

Figure 4:
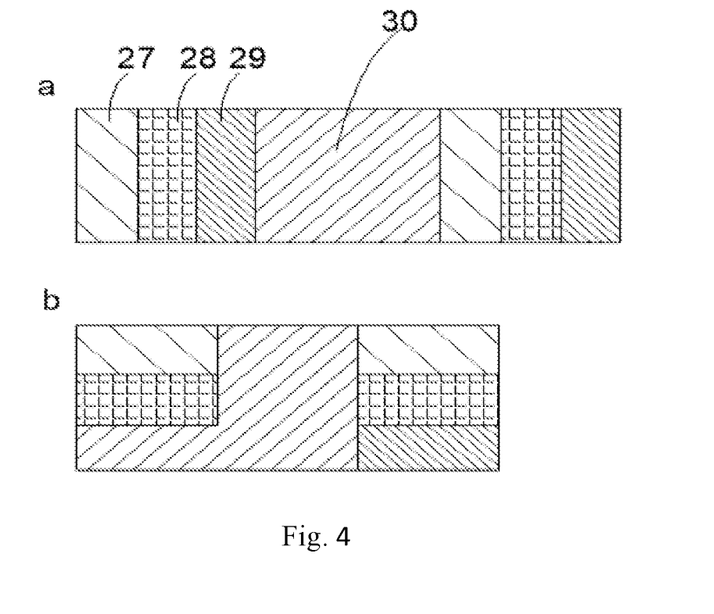
FIG. 4 is a display effect schematic diagram corresponding to when the existing display panel displays normally.

Furthermore, as depicted in FIG. 4, FIG. 4 is a display effect schematic diagram corresponding to when the existing display panel displays normally. FIG. a is a schematic diagram of the display status of the existing architecture at standard input, and FIG. b is the actual display effect schematic diagram of the font at the standard input of the existing architecture.

As depicted in FIG. 4, in the above-mentioned pixel units, each sub-pixel is a red sub-pixel 27, a green sub-pixel 28, a blue sub-pixel 29, and a black area 30, respectively. The arrangement of each pixel is that the red sub-pixel 27, the green sub-pixel 28, and the blue sub-pixel 29 are arranged in sequence. At the same time, the black area 30 is adjacent to the blue sub-pixel 29.

In the architecture of the traditional tri-gate design, when displaying the screen of the font, take the "vertical I" on the left of the letter "D" as an example. When the traditional tri-gate design turns ClearType on, the "I" area contains a group of a plurality of RGB three-color sub-pixels arranged along the short side of the display panel, and the blue sub-pixel B in the plurality of RGB three-color sub-pixels turns into a black state, and the width or range of the black area 30 is smaller during the display process. At this time, the display effect of the "vertical I" on the left of the letter "D" will be jagged, which will cause the font edge to look blurred when the font is displayed. Hence, the display effect is poor.

Figure 5:
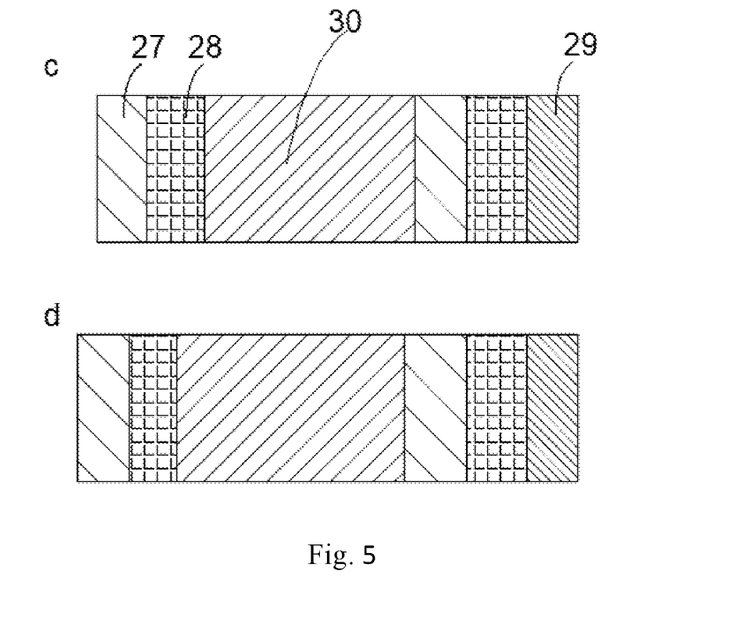
FIG. 5 is a display effect schematic diagram after adopting tri-gate-new architecture according to the embodiment of the present disclosure.

As depicted in FIG. 5, FIG. 5 is a display effect schematic diagram after adopting tri-gate-new architecture according to the embodiment of the present disclosure. FIG. c shows the display effect in the standard display state, and FIG. d shows the actual display effect after adopting the tri-gate-new architecture. Due to the change of the existing architecture, during display, the blue sub-pixel 29 adjacent to the black region 30 in the plurality of RGB three-color sub-pixels becomes a black state, that is, B+RGB. As depicted in FIG. c, the blue sub-pixel 29 on the right side of the green sub-pixel 28 turns into the black state. In this way, when the tri-gate-new architecture is adopted, the width of the black area 30 will be further increased during the actual display, as the actual display effect of FIG. d depicts. In FIG. d, the width of the left and right sides of the black area 30 is longer than the width corresponding to the black area 30 in the standard display state. Therefore, when displayed, the display effect of the font displayed in the embodiment of the present disclosure will be further enhanced, and the width of the font will be increased, thereby effectively improving the problem of font deformation and poor display effect in the traditional design.

The drive circuit of the present invention and the corresponding chip on film are set on the short side of the display panel, and the scan driving circuit is set on the glass substrate on the long side. Compared with other prior art solutions, it is compatible with the font algorithm of windows operating system while saving cost. For the full HD display apparatus, the normal architecture design scheme requires six chips on film, while the embodiment of the present invention only requires two chips on film, which saves cost to a greater extent while improving font deformation. For the ultra HD display apparatus, the traditional design scheme requires four chips on film, while the embodiment of the present invention also requires only four chips on film, the costs are the same, but the effect of improving font deformation is achieved.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
   a display substrate, comprising:
      a first long side, a second long side, a first short side, and a second short side, wherein the first long side is parallel to the second long side, and the first short side is parallel to the second short side;
      a plurality of scan lines parallel to the first short side and extending in a vertical direction;
      a plurality of data lines parallel to the first long side and extending in a horizontal direction; and
      a plurality of pixel units, wherein each of the pixel units comprises a plurality of sub-pixels, the sub-pixels in each of the pixel units comprises a red sub-pixel, a blue sub-pixel, and a green sub-pixel sequentially arranged in the horizontal direction, the sub-pixels of the pixel units form a plurality of pixel rows extending in the horizontal direction, the pixel rows comprise a first pixel row, a second pixel row, and a third pixel row arranged in sequence, the data lines comprises a first data line and a second data line, the first data line is disposed between the first pixel row and the second pixel row, the second data line is disposed between the second pixel row and the third pixel row, a (2i−1)th pixel unit in the first pixel row is coupled to the first data line, a (2i)th pixel unit in the second pixel row is coupled to the first data line, a (2i−1)th pixel unit in the second pixel row is coupled to the second data line, and a (2i)th pixel unit in the third pixel row is coupled to the second data line, and i is an integer greater than 0;
   a scan driving circuit disposed in a corresponding area of a long side edge of the display substrate, and coupled to the scan lines;
   a drive circuit board disposed in a corresponding area of a short side edge of the display substrate, and coupled to the data lines; and
   a chip on film, wherein one end of the chip on film is coupled to the display substrate, and another end of the chip on film is coupled to the drive circuit board.

2. The display panel of claim 1, wherein the scan driving circuit comprises a first scan driving circuit and a second scan driving circuit, the first scan driving circuit is disposed at an edge of the first long side, and the second scan driving circuit is disposed at an edge of the second long side.

3. The display panel of claim 1, wherein the sub-pixels of the pixel units further form a plurality of pixel columns, each of the scan lines is disposed between two adjacent pixel columns extending in the vertical direction, and the sub-pixels in each of the pixel columns are coupled disposed to one of the scan lines.

4. The display panel of claim 1, wherein the drive circuit board and the chip on film are correspondingly disposed in the corresponding areas of the short side edges on both sides of the display substrate.

5. The display panel of claim 4, wherein the number of the chip on film disposed in the corresponding area of the short side edge of the display substrate is two or three.

6. A display apparatus, comprising a display panel, wherein the display panel comprises:
   a display substrate, comprising:
      a first long side, a second long side, a first short side, and a second short side, wherein the first long side is parallel to the second long side, and the first short side is parallel to the second short side;
      a plurality of scan lines parallel to the first short side and extending in a vertical direction;

a plurality of data lines parallel to the first long side and extending in a horizontal direction; and a plurality of pixel units, wherein each of the pixel units comprises a plurality of sub-pixels, the sub-pixels in each of the pixel units comprises a red sub-pixel, a blue sub-pixel, and a green sub-pixel sequentially arranged in the horizontal direction, the sub-pixels of the pixel units form a plurality of pixel rows extending in the horizontal direction, the pixel rows comprise a first pixel row, a second pixel row, and a third pixel row arranged in sequence, the data lines comprises a first data line and a second data line, the first data line is disposed between the first pixel row and the second pixel row, the second data line is disposed between the second pixel row and the third pixel row, a (2i−1)th pixel unit in the first pixel row is coupled to the first data line, a (2i)th pixel unit in the second pixel row is coupled to the first data line, a (2i−1)th pixel unit in the second pixel row is coupled to the second data line, and a (2i)th pixel unit in the third pixel row is coupled to the second data line, and i is an integer greater than 0;

a scan driving circuit disposed in a corresponding area of a long side edge of the display substrate, and coupled to the scan lines;

a drive circuit board disposed in a corresponding area of a short side edge of the display substrate, and coupled to the data lines; and a chip on film, wherein one end of the chip on film is coupled to the display substrate, and another end of the chip on film is coupled to the drive circuit board.

7. The display apparatus of claim 6, wherein the scan driving circuit comprises a first scan driving circuit and a second scan driving circuit, the first scan driving circuit is disposed at an edge of the first long side, and the second scan driving circuit is disposed at an edge of the second long side.

8. The display apparatus of claim 7, wherein the drive circuit board and the chip on film are correspondingly disposed in the corresponding areas of the short side edges on both sides of the display substrate.

9. The display apparatus of claim 6, wherein the sub-pixels of the pixel units further form a plurality of pixel columns, each of the scan lines is disposed between two adjacent pixel columns extending in the vertical direction, and the plurality of the sub-pixels in each of the pixel columns are coupled to one of the scan lines.

* * * * *